(12) United States Patent
Maekawa et al.

(10) Patent No.: US 6,620,661 B2
(45) Date of Patent: *Sep. 16, 2003

(54) SINGLE CRYSTAL TFT FROM CONTINUOUS TRANSITION METAL DELIVERY METHOD

(75) Inventors: Masashi Maekawa, Nara (JP); Yukihiko Nakata, Vancouver, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 53 days.

This patent is subject to a terminal disclaimer.

(21) Appl. No.: 10/043,766

(22) Filed: Jan. 8, 2002

(65) Prior Publication Data

US 2002/0090801 A1 Jul. 11, 2002

Related U.S. Application Data

(63) Continuation of application No. 09/118,307, filed on Jul. 16, 1998, now Pat. No. 6,346,437.

(51) Int. Cl.[7] .............................................. H01L 21/336
(52) U.S. Cl. ...................... 438/166; 438/486; 438/487; 117/8
(58) Field of Search ................................. 438/166, 486, 438/487; 257/58; 117/8

(56) References Cited

U.S. PATENT DOCUMENTS

| | | | | | |
|---|---|---|---|---|---|
| 5,147,826 | A | * | 9/1992 | Liu et al. | 438/166 |
| 5,275,851 | A | * | 1/1994 | Fonash et al. | 438/166 |
| 6,077,731 | A | * | 6/2000 | Yamazaki et al. | 438/150 |
| 6,084,247 | A | * | 7/2000 | Yamazaki et al. | 257/58 |
| 6,162,667 | A | * | 12/2000 | Funai et al. | 438/166 |
| 6,228,693 | B1 | * | 5/2001 | Maekawa et al. | 438/166 |
| 6,346,437 | B1 | * | 2/2002 | Maekawa et al. | 438/166 |
| 6,458,637 | B1 | * | 10/2002 | Yamazaki et al. | 438/151 |

* cited by examiner

Primary Examiner—Mary Wilczewski
(74) Attorney, Agent, or Firm—David C. Ripma; Matthew D. Rabdan; Scott C. Krieger

(57) ABSTRACT

A TFT fabricated from a single crystal grain, and fabrication method has been provided. A large crystal grain is made by precise control of annealment, transition metal concentration, the density of transition metal nucleation sites, and the distance between nucleation sites. In one aspect of the invention, a diffusion layer permits the continual delivery of transition metal at a rate that both supports the lateral growth of di-silicide, and large distances between nucleation sites.

29 Claims, 7 Drawing Sheets

CONCENTRATION
OF Ni ATOMS

CONCENTRATION
OF Ni ATOMS

DEPLETION
REGION

SINGLE CRYSTAL TFT FROM CONTINUOUS TRANSITION METAL DELIVERY METHOD

CROSS REFERENCE TO RELATED APPLICATIONS

This application is a continuation of application Ser. No. 09/118,307, filed Jul. 16, 1998, now U.S. Pat No. 6,346,437 entitled "Single Crystal TFT From Continuous Transition Metal Delivery Method," invented by Maekawa et al.

BACKGROUND AND SUMMARY OF THE INVENTION

This invention relates generally to thin-film transistor (TFT) processes and fabrication, and more particularly, to a TFT polycrystalline film, and method of forming large grain sheets of polycrystalline silicon using transition metals semiconductor compounds, such as nickel silicide, to induce the crystallizing of an amorphous film through lateral growth from selective locations on a silicon wafer.

The demand for smaller electronic consumer products with higher resolution displays, spurs continued research and development in the area of liquid crystal displays (LCDs). The size of LCDs can be decreased by incorporating the large scale integration (LSI) and very large scale integration (VLSI) driver circuits, presently on the periphery of LCDs, into the LCD itself. The elimination of externally located driving circuits and transistors will reduce product size, process complexity, a number of process steps, and ultimately the price of the product in which the LCD is mounted.

The primary component of the LCD, and the component that must be enhanced for further LCD improvements to occur, is the thin-film transistor (TFT). TFTs are typically fabricated on a transparent substrate such as quartz, glass, or even plastic. TFTs are used as switches to allow the various pixels of the LCD to be charged in response to the driver circuits. TFT performance will be improved, and driver circuit functions incorporated into TFTs, by increasing the electron mobility in the TFT devices. Increasing the electron mobility of a transistor results in a transistor having faster switching speeds. Improved TFTs having increased electron mobility yield smaller LCD screens, lower power consumption, and faster transistor response times. Further LCD resolution enhancements will require that the TFTs mounted on the transparent substrates have electron mobility characteristics rivaling IC driver circuits currently mounted along the edges of the screen. That is, display and driver TFT located across the entire display must operate at substantially the same level of performance.

The carrier mobility of typical thin-film transistors, with active areas formed from amorphous film, is poor, on the order of 0.1 to 0.2 $cm^2/Vs$. Carrier mobility is improved by using crystallized silicon. Single crystal silicon transistors, which are usually used in TFT driver circuits, have electron mobilities on the order of 500 to 700 $cm^2/Vs$. Polycrystalline silicon transistor performance is between the two extremes, having mobilities on the order of 10 to 400 $cm^2/Vs$. Thin-film transistors having mobilities greater than 100 $cm^2/Vs$ would probably be useful in replacing LCD periphery mounted driver circuitry. However, it has been difficult to produce polycrystalline TFTs with electron mobilities of even 40 to 50 $cm^2/Vs$.

Single crystal silicon films, for use with LCDs, are difficult to fabricate when adhered to relatively fragile transparent substrates. A quartz substrate is able to withstand high process temperatures, but it is expensive. Glass is inexpensive, but is easily deformed when exposed to temperatures above 600° C. for substantial lengths of time. Even the fabrication of polycrystalline silicon transistors has been very difficult due to the necessity of using low temperature crystalline processes when glass is involved. Current polycrystallization processes typically require annealing times of approximately 24 hours, at 600° C., to produce TFTs having a mobility of approximately 30–50 $cm^2/Vs$. These processes are not especially cost effective due to the long process times, and the TFTs produced are not suitable for LCD driver circuits.

The process of heating amorphous silicon to form crystallized silicon is not entirely understood, and research on the subject continues. Variations in temperature, film thickness, the degree to which the amorphous matter melts, impurities in the film, and a range of other factors influence the annealing of amorphous silicon. Generally, large grains of crystallization, or crystallization able to support high carrier mobilities, occur in a polycrystalline film at a specific temperature near the melting point. Temperatures below this preferred temperature do not melt the amorphous silicon enough to form large grain areas, or to form uniformly crystallized film. Temperatures above the preferred temperature rapidly lead to bulk nucleation. The bulk nucleation of amorphous matter results in the spontaneous crystallization of an amorphous film into relatively small grain sizes so that the electron mobility is relatively poor.

Various annealing methods exist for turning amorphous silicon into polycrystalline silicon. The direct deposition of amorphous silicon film is probably the cheapest method of fabricating TFTs. Typically, the transparent substrate is mounted on a heated susceptor. The transparent substrate is exposed to gases which include elements of silicon and hydrogen. The gases decompose to leave solid phased silicon on the substrate. In a plasma-enhanced chemical vapor deposition (PECVD) system, the decomposition of source gases is assisted with the use of radio frequency (RF) energy. A low-pressure (LPCVD), or ultra-high vacuum (UHV-CVD), system pyrolytically decomposes the source gases at low pressures. In a photo-CVD system the decomposition of source gases is assisted with photon energy. In a high-density plasma CVD system high-density plasma sources, such as inductively coupled plasma and helicon sources, are used. In a hot wire CVD system the production of activated hydrogen atoms leads to the decomposition of the source gases. However, TFTs made from direct deposition have poor performance characteristics, with mobilities on the order of 1 to 10 $cm^2/Vs$.

Solid phase crystallization (SPC) is a popular method of crystallizing silicon. In this process, amorphous silicon is exposed to heat approaching 600° C. for a period of at least several hours. Typically, large batches of LCD substrates are processed in a furnace having a resistive heater source. TFTs made from this crystallization process are more expensive than those made from direct deposition, but have mobilities on the order of 50 $cm^2/Vs$. A rapid thermal anneal (RTA) uses a higher temperature, but for very short durations of time. Typically, the substrate is subjected to temperatures approaching 700 or 800° C. during the RTA, however, the annealing process occurs relatively quickly, in minutes or seconds. Glass substrates remain unharmed due to the short exposure time. Because the process is so rapid, it is economical to process the substrates serially. Single substrates can also be brought up to annealing temperatures faster than large batches of substrates. A tungsten-halogen, or Xe Arc, heat lamp is often used as the RTA heat source.

An excimer laser crystallization (ELC) process has also been used with some success in annealing amorphous silicon. The laser allows areas of the amorphous film to be exposed to very high temperatures for very short periods of time. Theoretically, this offers the possibility of annealing the amorphous silicon at its optimum temperature without degrading the transparent substrate upon which it is mounted. However, use of this method has been limited by the lack of control over some of the process steps. Typically, the aperture size of the laser is relatively small. The aperture size, power of the laser, and the thickness of the film may require multiple laser passes, or shots, to finally anneal the silicon. Since it is difficult to precisely control the laser, the multiple shots introduce non-uniformity's into the annealing process. Further, the wafers must be annealed serially, instead of in a furnace in batches. Although mobilities of over 100 $cm^2$/Vs are obtainable, TFTs made by this method are significantly more expensive than those made by direct deposition or SPC.

Also under investigation is the use of metal, such as aluminum, indium tin oxide, and transition metals such as nickel, cobalt, and palladium to encourage the crystallization of silicon. Nickel seems especially promising, as the lattice mismatch between nickel di-silicide and silicon is small, less than 1%. In general, nickel has been used to reduce the annealing temperature typically required in a conventional solid phase crystallization (SPC) from approximately 600° C. to a temperature in the range between approximately 500 to 550 ° C., so that the LCD substrates are less susceptible to shrinkage. The use of nickel also significantly shortens the annealing process times. TFTs made through this process are comparable in cost with those made by the SPC method, and the mobilities of metal-induced TFTs can approach 100 $cm^2$/Vs.

However, metal-induced crystallization requires the deposition of a transition metal on an amorphous silicon film, and annealment of the transition metal with the amorphous silicon. The result of annealing is dependent on how far the transition metal compounds have spread into the amorphous film. The possible results of annealment are unreacted amorphous silicon (or bulk nucleated silicon), unreacted transition metal, mono-silicide, and di-silicide. All of these compounds can induce high leakage currents in a transistor.

Liu. et al., U.S. Pat. No. 5,147,826, disclose the deposition of a non-continuous metal film on amorphous silicon so that the annealing temperature can be reduced to approximately 550 to 650° C. Fornash et al., U.S. Pat. No. 5,275,851 disclose a method of depositing extensive areas of metal film to silicon, and low annealing temperatures to crystallize silicon. However, neither method fosters the silicide-enhanced lateral crystal growth needed to fabricate polycrystalline silicon TFTs with very high electron mobility. Neither method discloses a method of controlling the lateral growth of silicide to eliminate unreacted metal and silicides in key areas of the transistor.

A method of rapid thermal annealing nickel silicide with amorphous silicon is presented in co-pending U.S. patent application Ser. No. 08/879,386, filed Jun. 20, 1997, entitled "Thin-Film Transistor Polycrystalline Film Through Nickel Induced, Rapid Thermal Annealing and Method for Same", invented by Masashi Maekawa, Attorney Docket No. SMT 258, which is assigned to the same assignees as the instant application. This patent application discloses the use of an RTA process to increase the quality of the polycrystalline, and to reduce annealing times. However, the invention does not disclose a method of preventing the incursion of nickel into sensitive areas of a transistor.

A method of selectively depositing nickel silicide to crystallize transistor source/drain regions in a two-step annealing process is presented in co-pending U.S. patent application Ser. No. 08/893,285, filed Jul. 15, 1997, entitled "Selective Silicide Thin-Film Transistor and Method for Same", invented by Masashi Maekawa, Attorney Docket No. SMT 239, which is assigned to the same assignees as the instant application. However, metal-induced annealment processes, in the later stages of transistor fabrication, can be cumbersome in some applications.

A method of selectively locating nickel nucleation sites to form large crystal grains is presented in co-pending U.S. patent application Ser. No. 09/092,831, filed Jun. 5, 1998, entitled "Selected Site, Metal-Induced, Continuous Crystallization and Method for Same", invented by Maekawa et al., which is assigned to the same assignees as the instant application. However, the above-mention invention cannot insure that the crystal grains formed will be large enough to form a transistor.

It would be advantageous if metal-induced annealment processes could be used to fabricate broad areas of high quality polycrystalline films in critical areas of the transistor.

It would be advantageous if transistor active areas could be formed with a transition metal at an early stage of transistor fabrication.

It would be advantageous if the unreacted transition metals and silicide products could be easily removed after annealment.

It would be advantageous if a TFT transistor could be formed from a single crystal grain to enhance performance.

Accordingly, a method for crystallizing an amorphous film into large grains comprising the steps of:

a) depositing a layer of the amorphous film;

b) implanting or depositing (alternatively referred to as doping) a first concentration of transition metal on the amorphous film, to form a first density of transition metal nucleus sites, with the nucleation sites being separated by a first distance, whereby a low density of nucleation sites is formed; and c) annealing to form large areas of single grain crystallized film, whereby a crystallized film is prepared for the fabrication of a high electron mobility transistors.

An ion implantation method implants transition metal within a rectangular window having a width in the range from 20 to 50 microns and a length of at least 50 microns. The exact length is dependent on the number of crystallization sites to be formed. In this manner, a concentration of transition metal no more than $2 \times 10^{19}$ atoms per cubed centimeter, and a density of transition metal nucleus sites no more than $1 \times 10^7$ per square centimeter is maintained. The distance between transition metal nucleus sites is no less than 2 microns.

A diffusion layer is used in a continual transition metal delivery system aspect of the invention. Then, Step b) is performed, at least partially, simultaneously with the performance of Step c). In this manner, transition metal is continually introduced during the annealing process to support the lateral growth of crystallization, without increasing the metal concentration above the defined minimum. An insulator film having a first thickness is deposited over the amorphous film. The transition metal is deposited over the insulator film and selectively etched to form a predetermined window size. Alternately, the insulator film is selectively thinned to define a window with a first thickness before the deposition of metal. Either way, Step c) includes the diffusion of transition metal through the first thickness of insulator film into the amorphous film, whereby the density of transition metal nucleuses is controlled.

When a single crystallized site is to be formed, the ratio of the transition metal window to the first area of crystallized film is in the range from 1:1 to 1:3. When multiple single crystal sites are to be formed, the ratio is greater than 1:1. Step c) includes the first area of crystallized film being in the range from 20 to 8,000 square microns ($\mu^2$), which is the area of a circle with a diameter in the range between 5 and 100 microns.

A further steps, precedes Step c), of:

b$_1$) ramping the temperature up to the annealing temperature of Step c) at a rate greater than 5 degrees C. per second, whereby the amorphous film is annealed at the intended temperature of Step c) for a larger crystal grain.

Step c) includes using a Rapid Thermal Annealing (RTA) process at a temperature of approximately 720 degrees C. and a time duration of approximately 2 minutes.

A thin-film transistor (TFT) comprising source/drain and channel regions of a single grain of crystallized film material is also provided. The amorphous film is doped with a transition metal at a first concentration, first density of nucleation sites, and a first distance between nucleation sites on an amorphous film. The amorphous film is annealed to form a first area of crystallized film, which is a single grain of crystal. A pattern is etched in the first area of crystallized film to form the source/drain regions, whereby a transistor is formed having high electron mobility and low leakage current in the transistor active areas.

DETAILED DESCRIPTION OF THE PREFERRED EMBODIMENT

Figure 1:
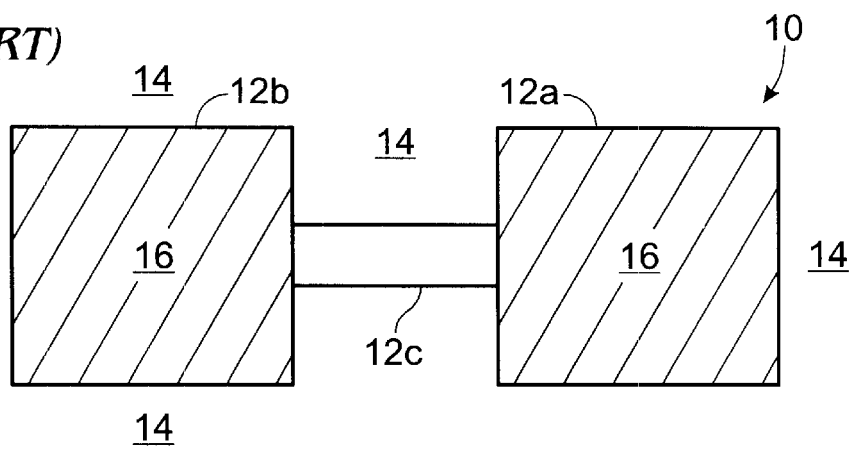
FIGS. 1–2 illustrate a conventional salicide process to crystallize source/drain regions of a transistor (prior art).
Figure 2:
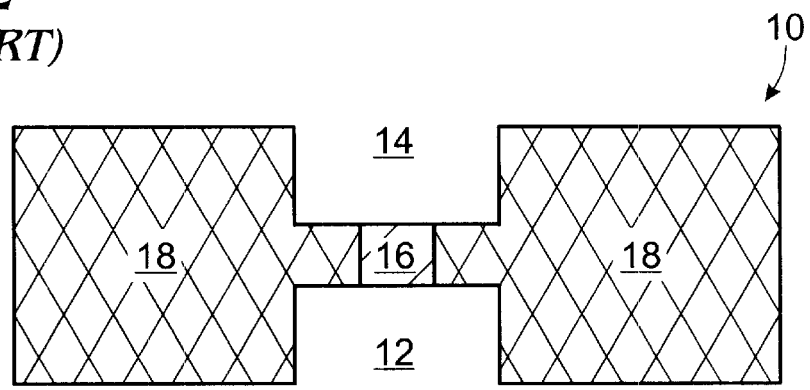

FIGS. 1–2 illustrate a conventional salicide process to crystallize source/drain regions of a transistor (prior art). FIG. 1 is a plan view of a transistor 10 in fabrication having silicon source 12a, silicon drain 12b, and silicon channel region 12c. Silicon regions 12a, 12b, and 12c are surrounded by oxidized silicon 14, or a similar insulating material. The source and drain regions 12a and 12b are covered with a layer of transition metal 16. It is typical in the deposition of transition metal layer 16 to cover surrounding areas 14, however, in the self-aligning silicide (salicide) process transition metal 16 only reacts with silicon. Therefore, metal 16 is not shown overlying areas 14. Transition metal 16 is also not shown overlying channel region 12c, since channel region 12c is usually covered by a gate oxide layer, and even a gate electrode at this stage of the process. Neither the gate oxide layer, nor gate electrode is shown for the sake of clarity.

FIG. 2 illustrates transistor 10 of FIG. 1 following an annealing process. Transition metal 16 has moved along a lateral growth front out from silicon areas 12a and 12b. At the finish of the annealing process the two growth fronts intersect in the center of the channel region, labeled 12c. The silicon regions behind the growth front of transition metal 16 have been transformed with transition metal 16 into crystallized silicon 18. That is, silicon areas 12a, 12b, and parts of 12c have been crystallized. Although the bulk of silicon areas 12a and 12b may be crystallized silicon, devoid of transition metal semiconductor compounds, such as silicide, the limited source of amorphous silicon in area 12c and the intersecting fronts may result in an area of silicide in channel region 12c.

Typically, source drain areas 12a and 12b are amorphized in response to large doping implants in the formation of active source/drain regions. When source/drain regions 12a and 12b are annealed again for implant activation, a danger exists that transition metal grains 16 in channel region 12c could migrate back into the amorphous source/drain regions 12a and 12b. The presence of transition metal grains in source/drain regions 12a and 12b increases leakage current as transition metal 16 tends to act as a short across the reverse bias junction.

Figure 3:
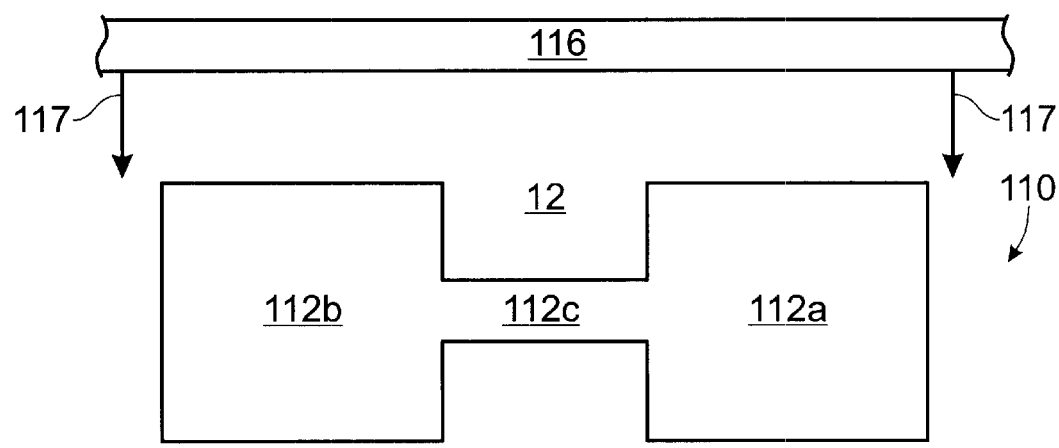
FIGS. 3–4 illustrate a transistor being formed on a layer of amorphous silicon, where silicidation metal is introduced outside transistor active regions (prior art).
Figure 4:
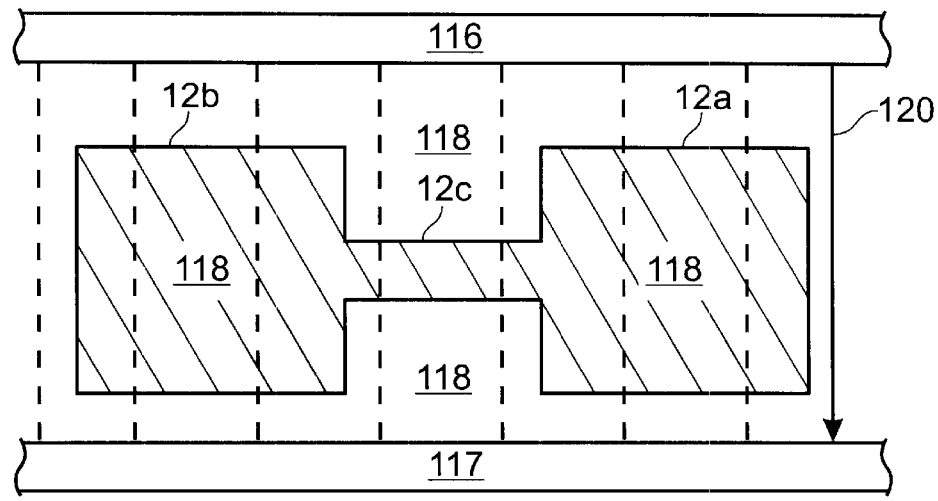

FIGS. 3–4 illustrate a transistor 110 being formed on a layer of amorphous silicon 112, where silicidation metal 116 is introduced outside transistor active regions prior art). FIG. 3 depicts source 112a, drain 112b, and channel 112c to be formed from amorphous silicon layer 112 after crystallization. During annealment, a front of transition metal 16, represented by arrows 117, grows across silicon layer 12.

FIG. 4 illustrates transistor 110 after annealment. The lateral growth has continued through active areas 112a, 112b, and 112c. That is, the front of unreacted transition metal 116, in the form of a transition metal semiconductor compound 117 has moved through silicon film 112. Behind the lateral growth front of transition metal 116 front, is a polycrystalline silicon 118. Actually, the entire sheet of silicon 112 of FIG. 3 behind the growth front has been converted into polycrystalline silicon 118, including active areas 112a, 112b, and 112c. The dotted lines running across polycrystalline film 118 represent borders between areas of identical lattice alignment. After annealment, transition metal compounds in areas 116 and 117 are etched away. Transistor active areas 112a, 112b, and 112c are free of suicide 117. However, a long annealing time was required because of the long lateral crystallization length or growth front, represented by arrow 120. Further, silicide regions 116 and 117 cannot be used in device fabrication, imposing restrictions upon device layout.

When metal is widely distributed into the semiconductor film, the dose of metal required for crystallization is generally lower than the dose required for selective introduction. However, metal-semiconductor compounds tend to be randomly distributed in the semiconductor film, resulting in high leakage currents. Selective deposition allows control over the areas in which the metal-semiconductor compounds reside. But selective distribution required higher concentrations of metal. High concentrations of metal result in closely grouped nucleation sites and, ultimately, same crystal grains.

The present invention permits selective placement of transition metal and low transition metal concentrations.

Figure 5:
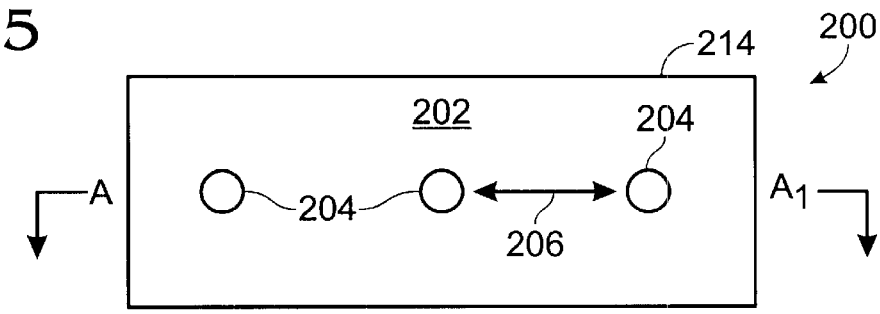
FIGS. 5–7, 9–11, and 13–14 depict steps in the formation of a completed thin-film transistor (TFT) comprising source/ drain and channel regions of a single grain of crystallized first film material.

FIGS. 5–7, 9–11, and 13–14 depict steps in the formation of at least a single completed thin-film transistor (TFT) comprising source/drain and channel regions of a single grain of crystallized first film material. FIG. 5 is a plan view of transistor 200. An amorphous first semiconductor film 202 is doped with a transition metal at a first concentration, first density of nucleation sites 204, and a first distance 206 between nucleation sites 204. First film material 202 is selected from the group consisting of silicon, germanium, silicon carbide, and silicon-germanium compounds. The transition metal of nucleation sites 204 is selected from the group consisting of Al, Ni, Ti, Co, and Pd.

Figure 6:
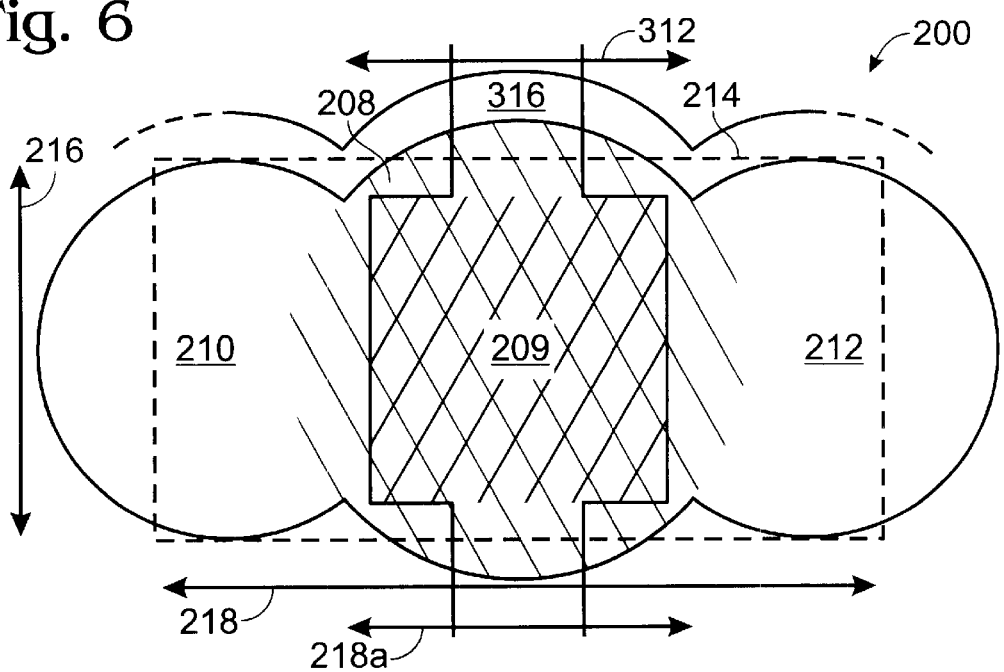

FIG. 6 depicts transistor 200 of FIG. 5 following annealing. Amorphous first film 202 is annealed to form a first area of crystallized first film 208. First area 208 (cross-hatched) is a single grain of crystal. In subsequent steps a pattern is etched into first area 208 of crystallized first film to form the source/drain regions 209 (double cross-hatched), whereby a transistor is formed having high electron mobility and low leakage current in the transistor active areas. Areas 210 and 212 are single crystal grains for the fabrication of neighboring transistors. In some aspects of the invention, the subsequently formed transistors overlie neighboring areas of crystallized film, such as areas 208, 210, and 212. In those circumstances a transistor is formed from multiple crystal grains.

Figure 7:
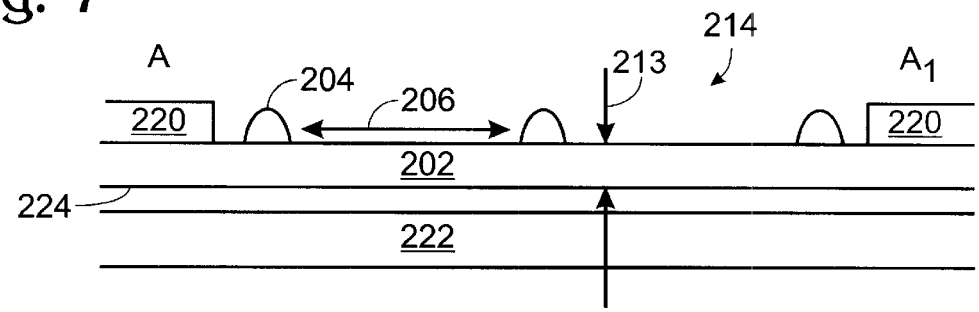

FIG. 7 is a partial cross-sectional view of transistor 200 of FIG. 5. Amorphous first film 202 has a thickness 213 in the range from 200 to 10,000 Å. Amorphous first film 202 is doped with transition metal 204 through a transition metal window 214. That is, nucleation sites 204 are formed within a rectangular window 214 overlying the subsequently formed first area 210 (also areas 210 and 212) of crystallized film. In FIG. 6, where at least a second (and third) TFT is to be formed adjoining the first TFT 209, such as on crystallized areas 210, and 212, transition metal 214 is doped within a rectangular window overlying crystallized first film areas 208, 210, and 212 having a width 216 in the range from 20 to 50 microns, and a length 218 of 50 microns, or greater. When one TFT is to be fabricated, transition metal is doped within a rectangular window overlying first crystallized area 208 having a width 216 in the range from 20 to 50 microns and a length 218a in the range from 60 to 150 microns. The ratio of transition metal window 214 area, of length 218a and width 216 to area 208 of crystallized film is in the range from 1:1 to 1:3. That is, first area 208 is 1 to 3 times larger than window 214 area. First area 208 of crystallized first film is in the range from 20 to 8,000 square microns ($\mu^2$). FIG. 6 depicts approximately 1:1 ratio.

Returning to FIG. 7, an insulator or photoresist mask 220 is used to define window 214. TFT 200 further comprising a glass substrate 222. In some aspects of the invention, a barrier layer 224 overlies glass substrate 222. Then, first area 208 of crystallized first film is formed overlying barrier level 224.

The heart of the invention is the relationship between annealing temperature, transition metal concentration, transition metal density, and the spacing between nucleation sites. In the prior art, a concentration of $2 \times 10^{19}$ atoms per cubed centimeter typically lead to an increase in the transition metal nucleation site density above $1 \times 10^7$ per square centimeter. At these higher densities, the spacing between nucleation sites decreases, so that smaller crystal grain are formed. However, when the concentration of transition metal falls too far below $2 \times 10^{19}$ atoms per cubed centimeter, there is insufficient metal to support the lateral growth of transition metal semiconductor compounds, such as di-silicide, during annealment.

Transition metal 204 doping is selected from the group consisting of ion implantation and CVD deposition methods. The first concentration of transition metal is less than $2 \times 10^{19}$ atoms per cubed centimeter, and the first density of transition metal nucleus sites are less than $1 \times 10^7$ per square centimeter. Only three nucleation sites are shown in FIGS. 5–7 for the purpose of clarity. First distance 206 between transition metal nucleus sites 204 is no less than 2 microns.

Figure 8:
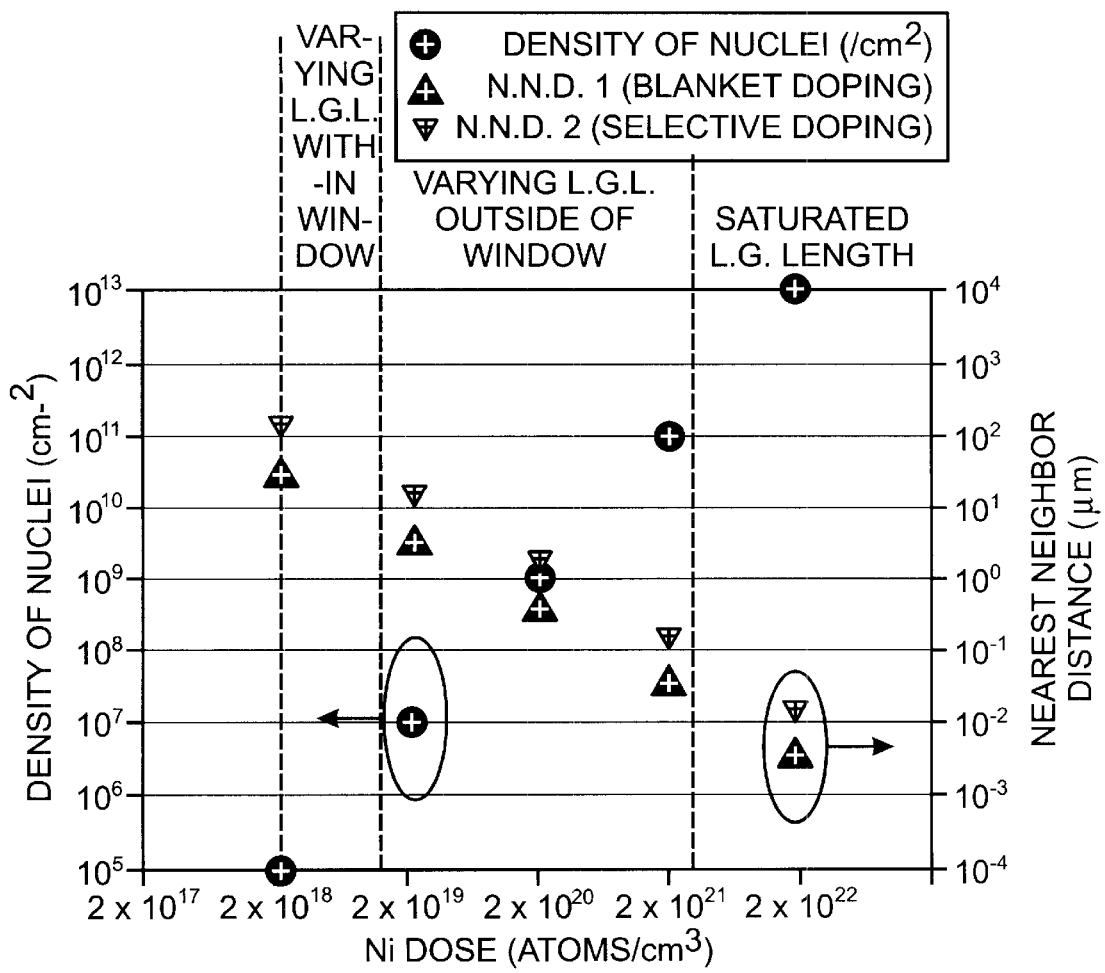
FIG. 8 is a graph detailing the relationship between transition metal deposition and crystal grain size.

FIG. 8 is a graph detailing the relationship between transition metal deposition and crystal grain size. To alleviate the above-mentioned transition metal concentration problem, a continuous transition metal delivery system was developed. That is, transition metal implanting occurs, at least partially, simultaneously with the annealing of said first film, whereby said transition metal is continually introduced during the annealing process to support the lateral growth of crystallization. FIG. 8 shows that at a nucleation density of $1 \times 10^7/cm^2$, the concentration of Ni atoms is approximately $2 \times 10^{19}$ atoms/cm$^3$, and the nearest neighbor distance (N.N.D.) is 2 microns.

Annealing is performed with an RTA process at a temperature in the range from 600 to 800 degrees C., for a time duration in the range from 1 second to 15 minutes. In one aspect of the invention, annealing is performed with an RTA process at a temperature in the range from 700 to 750 degrees C., for a time duration in the range from 1 to 5 minutes. In one preferred embodiment, the annealing is performed with an RTA process at a temperature at approximately 720 degrees C. and a time duration of approximately 2 minutes. In one aspect of the invention, the temperature is ramped-up to the annealing temperature at a rate greater than 5 degrees C. per second, whereby the first film is annealed at the intended temperature for larger crystal grains.

Figure 9:
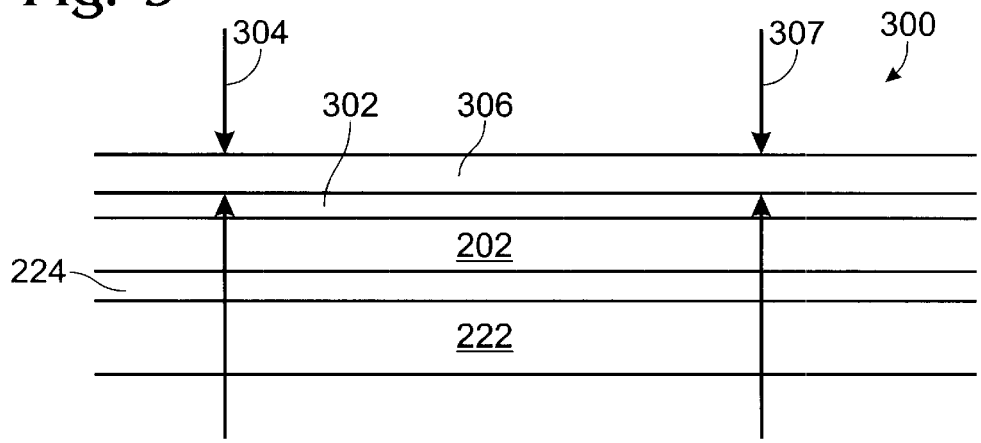

FIG. 9 is a partial cross-sectional view of a TFT 300 fabricated in accordance with the present invention. TFT 300 is comprised of a transparent substrate 222, and overlying barrier level 224. An amorphous film 202 overlies barrier level 224. An insulator film 302 having a first thickness 304 is deposited over amorphous first film 202. Insulator film 302 has a first thickness 304 in the range from 10 to 100 Å. Insulator material 302 is selected from the group consisting of silicon dioxide and silicon nitride.

Transition metal 306 is deposited overlying insulator film 302. Transition metal 306 is deposited with a thickness 307 in the range from 10 to 1000 Å. During annealing, transition metal 306 diffuses through insulator film 302 into said amorphous first film 202. In this manner, the formation of transition metal nucleus sites 204 (see FIGS. 5-7) is controlled. Transition metal doping occurs, at least partially, simultaneously with the annealing of first film 202. Transition metal 306 is continually introduced during the annealing process to support the lateral growth of crystallization.

Figure 10:
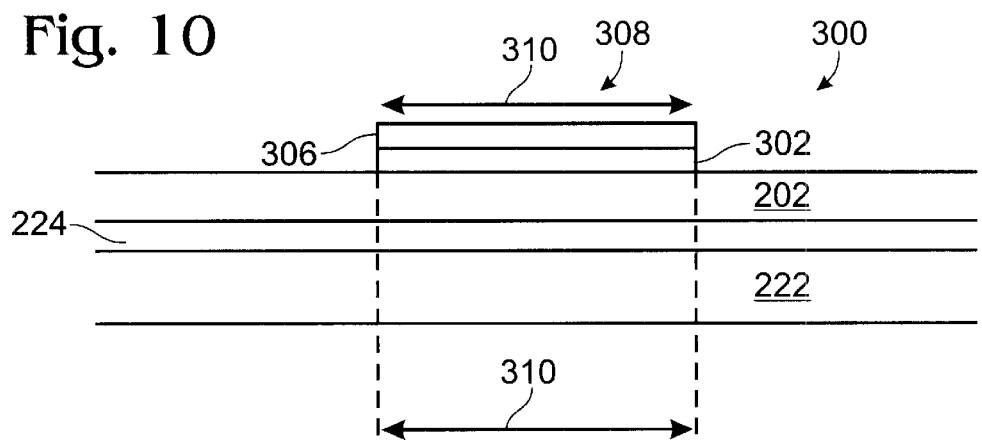

FIG. 10 depicts TFT 300 of FIG. 9 following an etching step. Transition metal 306 overlying insulator film 302 is selectively etched before annealing to form a window 308 of transition metal 306. FIG. 10 shows only the width 310 of window 308. In this manner, the size of first area 208 of crystallized first film is influenced (see FIG. 6).

Figure 11A:
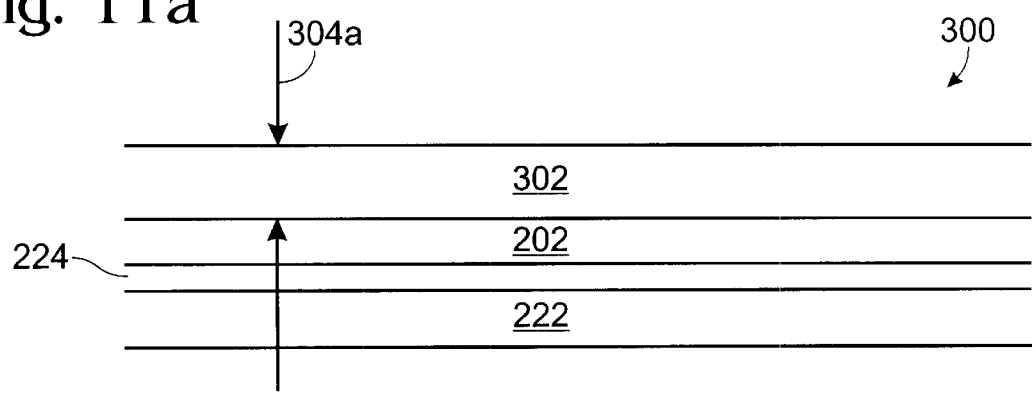
Figure 11B:
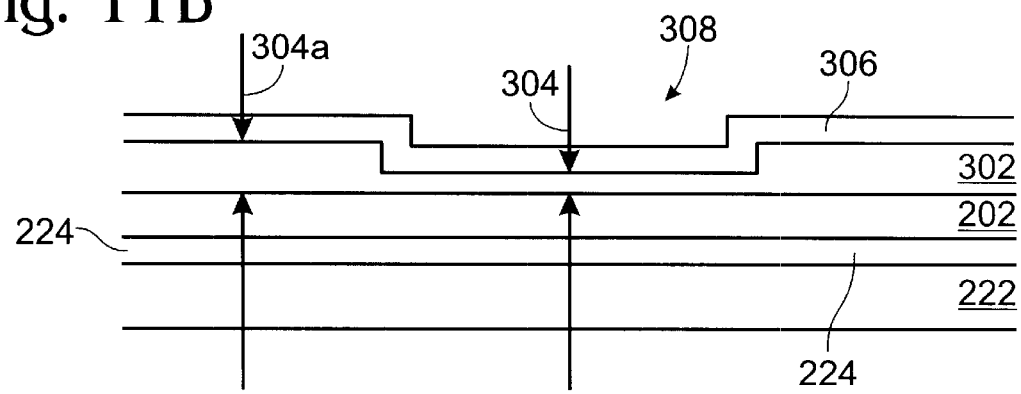

Alternately, FIG. 11a depicts a transparent substrate 222, and overlying barrier level 224. An amorphous film 202 overlies barrier level 224. An insulator film 302 has an initial thickness 304a, of 500 Å, or greater, is deposited over amorphous first film 202. FIG. 11b depicts insulator film 302 following selective etching to form an area having a first thickness 304, less than initial thickness 304a. Transition metal 306 is deposited over first thickness 304 to form transition metal window 308, whereby the size of first area 208 of crystallized first film is influenced (see FIG. 6).

Figure 12A:
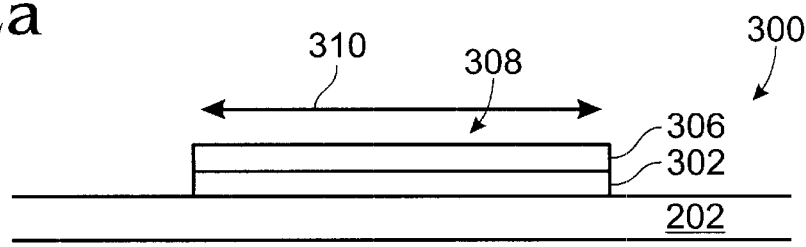
FIGS. 12a through 12c depict the delivery of the transition metal and the formation of the transition metal semiconductor compound during annealment.
Figure 12B:
Figure 12C:
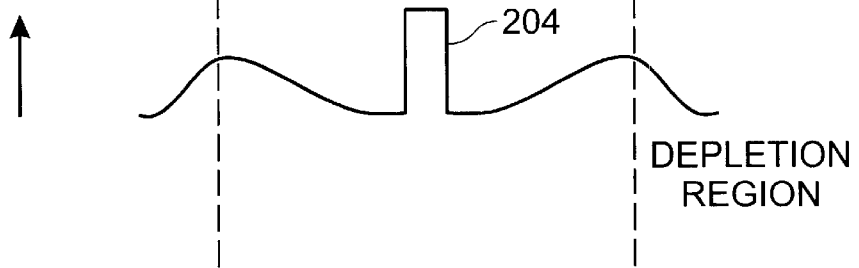

FIGS. 12a through 12c depict the delivery of transition metal 304 and the formation of transition metal semiconductor compound 316 during annealment. FIG. 12a shows transistor 300 with insulator film 302 overlying amorphous film 202, such as Si. Transition metal 306, such as Ni, overlies Si 202. Transition metal window 308 is formed by the steps illustrated in FIGS. 9–10, and by the steps depicted in FIGS. 11a and 11b.

As shown in FIG. 12b, during annealment, Ni atoms diffuse through insulator film 302 uniformly. Thickness 304 of insulator film 302 and thickness 307 of Ni film 306 are varied to control the concentration of Ni.

FIG. 12c depicts the concentration of Ni atoms in the later stages of annealment. A nucleation site 204 is formed in the center of window 308, with relatively low concentrations of Ni atoms 306 in the remaining area of window 308.

Returning briefly to FIG. 6, transition metal semiconductor compounds 316 surrounding first area 208 of crystallized first film are removed when source/drain regions 209 are defined after annealing, whereby crystallized film is cleaned of materials which promote high leakage currents.

Figure 13:
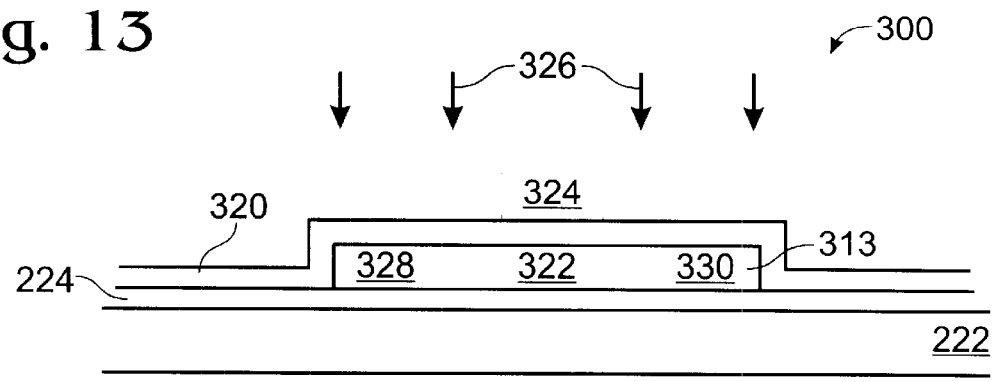

FIG. 13 depicts further fabrication steps of transistor 300 of FIG. 10 after annealing and transition metal semiconductor compound 316 removal. An oxide layer 320 overlies the channel region 322. A gate electrode 324 overlies oxide layer 320. In some aspects of the invention, phosphorous 326 is implanted into source 328 and drain 330 regions. Alternately, boron 326 is implanted. Annealing is performed to activate implanted species 326.

Figure 14:
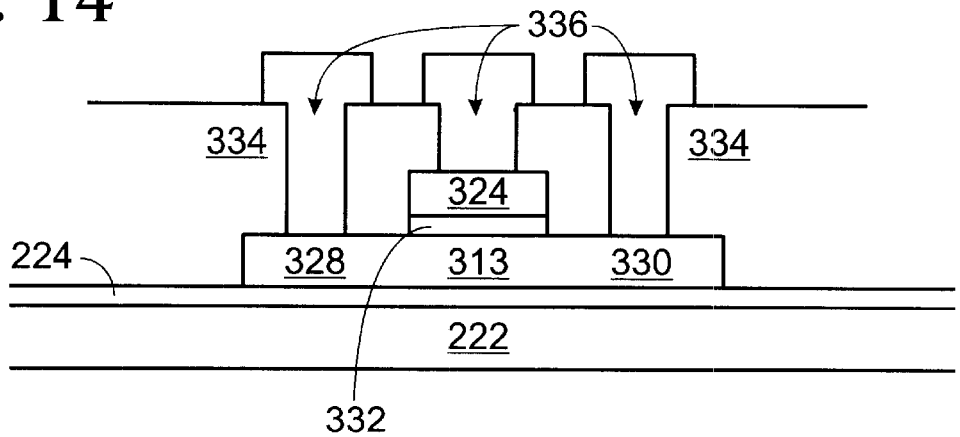

FIG. 14 depicts TFT 300 of FIG. 13 following the removal of oxide layer 320. A gate oxide layer 332 remains, gate electrode 324 overlies gate oxide layer 332. A dielectric interlevel 334 is deposited over transistor 300. Contact holes 336 are defined through dielectric interlevel 334 and metal 338 is deposited in contact holes 336 so that an electrical interface is made to source/drain regions 328/330. In this manner, a top gate TFT is fabricated. Alternately, but not shown, a bottom gate TFT is fabricated by depositing gate electrode 324 and gate oxide layer 332 before deposited first film 202, as is well known in the art.

Figure 15:
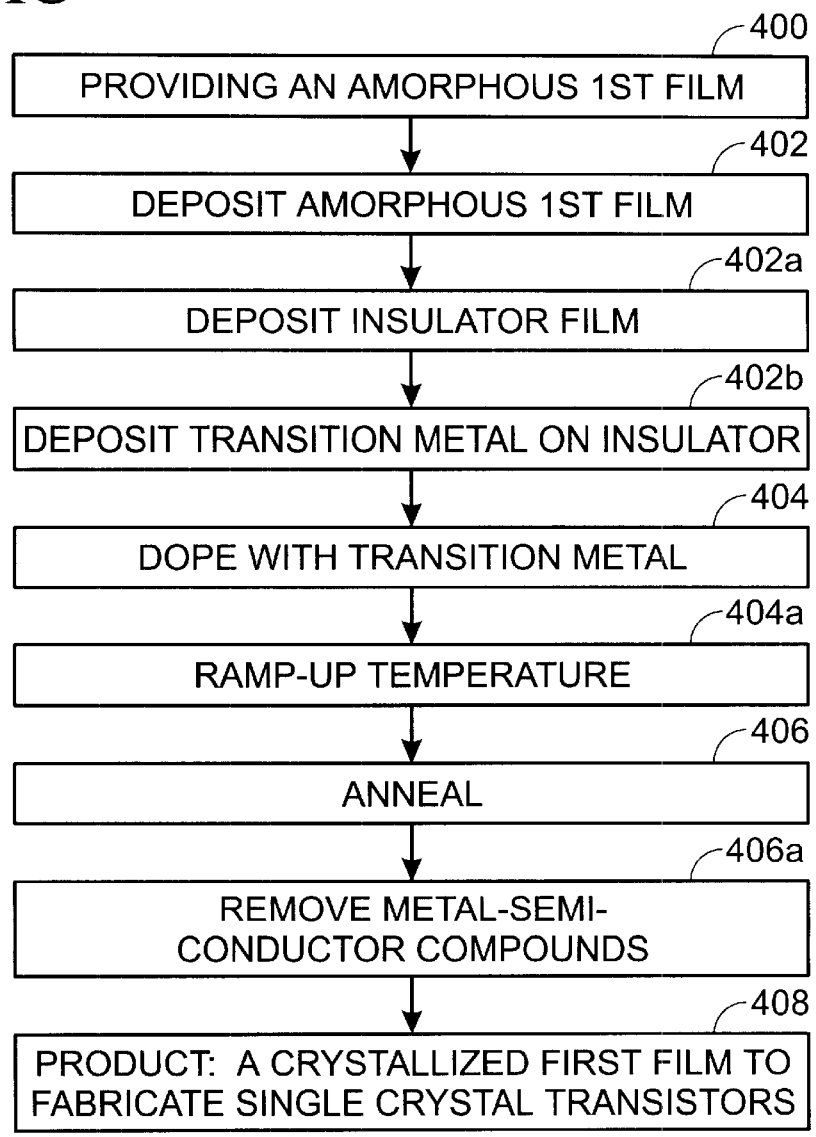
FIG. 15 is a flowchart illustrating steps in a method for forming large crystal grains.

FIG. 15 is a flowchart illustrating steps in a method for forming large crystal grains. Step 400 provides an amorphous film. Step 402 deposits a layer of the amorphous first film. Step 402 includes an amorphous first film selected from the group consisting of silicon, germanium, silicon carbide, and silicon-germanium compounds. Step 402 includes an amorphous first film having a thickness in the range from 200 to 10,000 Å. Step 404 dopes the amorphous first film with a first concentration of transition metal, to form a first density of transition metal nucleus sites, with the nucleation sites being separated by a first distance. In this manner, a low density of nucleation sites is formed. Step 406 anneals to form a first area of a single grain of crystallized first film. Step 408 is a product, a crystallized film prepared for the fabrication of a single crystal transistor.

A further step, follows Step 406. Step 406a removes transition metal semiconductor compound surrounding the first area of crystallized first film, whereby the film is cleaned of materials which promote high leakage currents.

In some aspects of the invention, Step 404 includes using an ion implantation method to dope amorphous first film with transition metal within a rectangular window. It is convenient to describe the transition metal window as a rectangular window that varies from approximately a square, or circular shape to an elongated strip. Alternately, the window may be other shapes with the same approximate area as described below. When a single first crystallized area is to be formed in Step 406, Step 404 includes doping within a rectangular transition metal window having a width in the range from 20 to 50 microns and a length in the range from 60 to 150 microns. The smaller width measurement correspond to smaller length measurements. The ratio of the area of the transition metal window of Step 402b to the first area of crystallized film of Step 406 is in the range from 1:1 to 1:3.

When at least a second area of single grain crystallized film is formed in Step 406, such as when series of crystallized areas is formed along an elongated strip of first film to form a series of transistors, Step 404 includes doping within a transition metal window having a width in the range from 20 to 50 microns and a length of 50 microns, or greater.

In other aspects of the invention, Step 404 is performed, at least partially, simultaneously with Step 406, whereby transition metal is continually introduced during the annealing process to support the lateral growth of crystallization. Then, the method includes further steps following Step 402. Step 402a deposits an insulator film having a first thickness overlying the amorphous first film. Step 402a includes an insulator layer first thickness in the range from 10 to 100 Å. Step 402a includes an insulator material selected from the group consisting of silicon dioxide and silicon nitride. Step 402b deposits the transition metal overlying the insulator film first thickness. Step 402b includes depositing transition metal having a thickness in the range from 10 to 1000 Å. The transition metal selected from the group consisting of Al, Ni, Ti, Co, and Pd. Then, Step 406 includes the diffusion of transition metal through the insulator film first thickness into the amorphous first film, whereby the density of transition metal nucleuses is controlled.

In some aspects of the invention, Step 402b selectively etches the transition metal deposited in Step 402b to form a window of transition metal, whereby the size of the first area of crystallized film is influenced. In other aspects of the invention, Step 402a includes depositing the insulator film with an initial thickness of 500 Å, or greater. The insulator film is selectively etched to form an area having a first thickness, less than the initial thickness. Then, Step 402b includes forming a window of transition metal over the insulator film first thickness, whereby the size of the first area of crystallized film is influenced.

Step 406 includes the first area of crystallized first film being in the range from 20 to 8,000 square microns ($\mu^2$). Typically, Step 402b includes the transition metal window being a rectangle having a width in the range from 20 to 50 microns and a length in the range from 60 to 150 microns, as explained above with the ion implantation process. Likewise, when Step 406 includes forming at least a second area of crystallized first film, Step 402b includes the transition metal window being a rectangle having a width in the range from 20 to 50 microns and a length of 50 microns, or greater.

In some aspects of the invention, Step 404 includes a first concentration of transition metal no more than $2 \times 10^{19}$ atoms per cubed centimeter, and the first density of transition metal nucleus sites no more than $1 \times 10^7$ per square centimeter. Step 404 includes a first distance between transistion metal nucleus sites of no less than 2 microns.

In some aspects of the invention, further steps, precede Step 406. Step 404a ramps-up the temperature to the annealing temperature of Step 406 at a rate greater than 5 degrees C. per second, whereby the first film is annealed at the intended temperature of Step 406 for a larger crystal grain.

Step 406 includes using a Rapid Thermal Annealing (RTA) process at a temperature in the range from 600 to 800 degrees C., and a time duration in the range from 1 second to 15 minutes. In one aspect of the invention, Step 406 includes using a Rapid Thermal Annealing (RTA) process at a temperature in the range from 700 to 750 degrees C., and a time duration in the range from 1 to 5 minutes. In another aspect of the invention, Step 406 includes using a Rapid Thermal Annealing (RTA) process at a temperature of approximately 720 degrees C. and a time duration of approximately 2 minutes.

When a TFT is be fabricated, Step 400 provides a glass substrate and a barrier layer overlying the glass substrate. Then, Step 402 includes depositing the first film overlying the barrier layer and glass substrate. Further steps (not shown), are involved. When a top gate transistor is to be performed, additional steps follow Step 406. Step 406b forms transistor source, drain, and channel regions within the first area of crystallized film, whereby the source, drain, and channel regions are formed from a single crystal grain, without the presence of transition metal semiconductor compounds. Step 406c forms a gate oxide layer. Step 406d forms a gate electrode. Step 406e implants doping species. Step 406f anneals to activate the implanted species, whereby a top gate TFTs is formed. When a bottom gate TFT is formed, Steps 406c and 406d precede Step 402, as is well known in the art.

Figure 16:
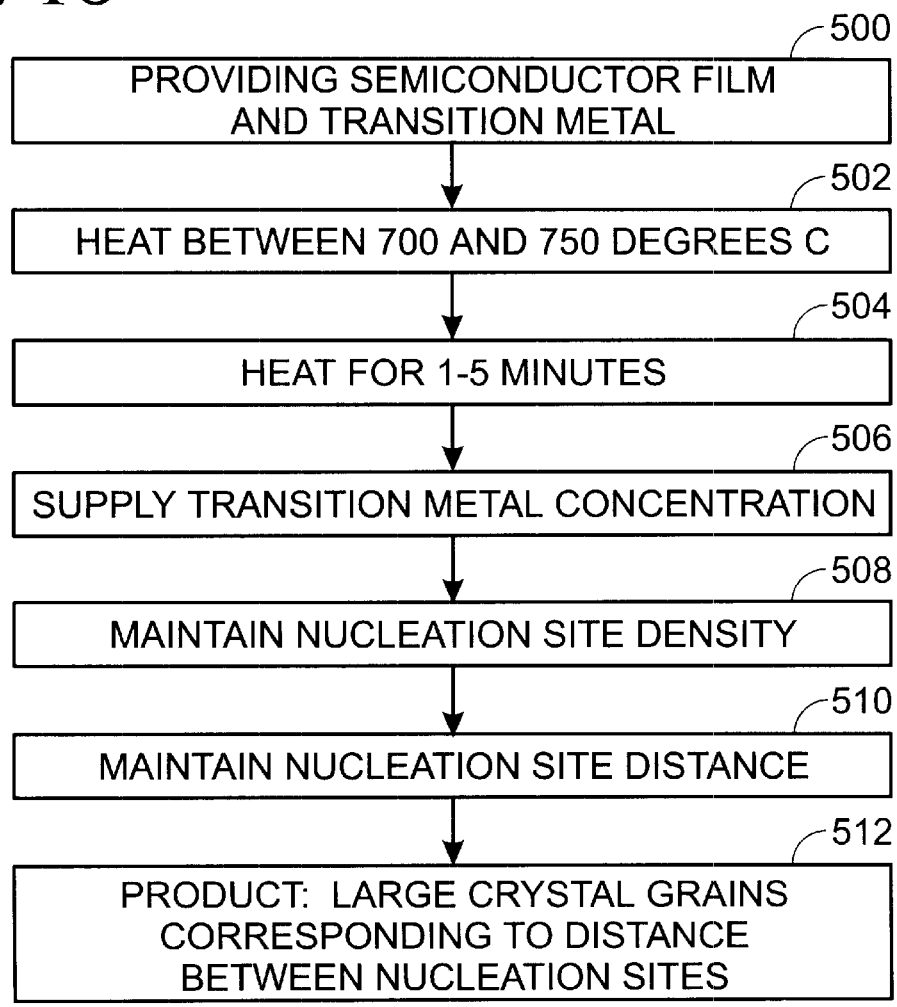
FIG. 16 is a flowchart illustrating another aspect of a method of forming a crystallized film with large crystal grains.

FIG. 16 is a flowchart illustrating another aspect of a method of forming a crystallized film with large crystal grains. Step 500 provides a semiconductor film and a transition metal. Step 502 heats the semiconductor film to a temperature in the range from 700 to 750 degrees C. Step 504 heats the semiconductor film for a duration in the range from 1 to 5 minutes. Step 506 supplies a transition metal concentration of no more than $2 \times 10^{19}$ atoms/cm$^3$. Step 508 maintains a transition metal nucleation site density of no more than $1 \times 10^7$/cm$^2$. Step 510 maintains a distance between transition metal nucleation sites of no less than 2 microns. Step 512 forms large grains of crystallized semiconductor film corresponding to the distance between transition metal nucleation sites.

A TFT fabricated from a single crystal grain, and fabrication method has been provided. A large crystal grain is made by precise control of annealment, transition metal concentration, the density of transition metal nucleation sites, and the distance between nucleation sites. In one aspect of the invention, a diffusion layer permits the continual delivery of transition metal at a rate that both supports the lateral growth of di-silicide, and large distances between nucleation sites. Other variations and embodiments of the invention will occur to those skilled in the art.

What is claimed is:

1. A method for crystallizing an amorphous film into large grains comprising the steps of:
   a) depositing a layer of the amorphous first film;
   b) doping the amorphous first film with a first concentration of transition metal, to form a first density of transition metal nucleation sites of no more than $1 \times 10^7$ per square centimeter, with the nucleation sites being separated by a first distance, whereby a low density of nucleation sites is formed; and
   c) annealing to form a first area of a single grain of crystallized first film, whereby a crystallized film is prepared for the fabrication of a single crystal transistor.

2. A method as in claim 1 including a further step, following Step c), of:
   d) removing transition metal semiconductor compound surrounding the first area of crystallized first film, whereby the film is cleaned of materials which promote high leakage currents.

3. A method as in claim 1 in which Step b) includes using an ion implantation method to dope amorphous first film with transition metal within a rectangular window having a width in the range from 20 to 50 microns.

4. A method as in claim 1 in which Step b) includes using an ion implantation method to dope amorphous first film with transition metal within a rectangular window having a length in the range from 60 to 150 microns.

5. A method as in claim 3 in which Step b) includes using an ion implantation method to dope amorphous first film with transition metal within a rectangular window having a width in the range from 20 to 50 microns and a length of 50 microns, or greater, and in which Step c) includes forming at least a second area of a single grain crystallized first film.

6. A method as in claim 1 in which Step b) is performed, at least partially, simultaneously with Step c), whereby transition metal is continually introduced during the annealing process to support the lateral growth of crystallization.

7. A method as in claim 6 including further steps, following Step a), of:
   a$_1$) depositing an insulator film having a first thickness overlying the amorphous first film;
   a$_2$) depositing the transition metal overlying the insulator film first thickness to form a window of transition metal; and
   in which Step c) includes the diffusion of transition metal through the insulator film first thickness into the amorphous first film, whereby the density of transition metal nucleuses is controlled.

8. A method as in claim 7 in which Step a$_2$) includes selectively etching the transition metal deposited in Step a$_2$) to form a window of transition metal, whereby the size of the first area of crystallized film is influenced.

9. A method as in claim 7 in which Step a) includes depositing the insulator film with an initial thickness, in which the insulator film is selectively etched to form an area having a first thickness, less than the initial thickness, and in which Step a$_2$) includes forming a window of transition metal over the insulator film first thickness, whereby the size of the first area of crystallized film is influenced.

10. A method as in claim 7 in which the ratio of the area of the transition metal window of Step a$_2$), to the first area of crystallized film is in the range from 1:1 to 1:3.

11. A method as in claim 10 in which Step c) includes the first area of crystallized first film being in the range from 20 to 8,000 square microns ($\mu^2$).

12. A method as in claim 7 in which Step a$_2$) includes the transition metal window being a rectangle having a width in the range from 20 to 50 microns.

13. A method as in claim 7 in which Step a$_2$) includes the transition metal window being a rectangle having a length in the range from 60 to 150 microns.

14. A method as in claim 7 in which Step a$_2$) includes the transition metal window being a rectangle having a width in the range from 20 to 50 microns and a length of 50 microns, or greater, and in which Step c) includes forming at least a second area of crystallized first film.

15. A method as in claim 9 in which Step $a_1$) includes depositing an insulator layer having an initial thickness of 500 Å, or greater.

16. A method as in claim 7 in which Step $a_1$) includes an insulator first thickness in the range from 10 to 100 Å.

17. A method as in claim 7 in which Step $a_1$) includes an insulator material selected from the group consisting of silicon dioxide and silicon nitride.

18. A method as in claim 7 in which Step $a_2$) includes depositing transition metal having a thickness in the range from 10 to 1000 Å.

19. A method as in claim 1 in which Step b) includes the first concentration of transition metal being no more than $2 \times 10^{19}$ atoms per cubed centimeter.

20. A method as in claim 1 in which Step b) includes a first distance between transition metal nucleation sites of no less than 2 microns.

21. A method as in claim 1 in which Step b) includes depositing a transition metal selected from the group consisting of Al, Ni, Ti, Co, and Pd.

22. A method as in claim 1 including further steps, preceding Step c), of:
$b_1$) ramping the temperature up to the annealing temperature of Step c) at a rate greater than 5 degrees C. per second, whereby the first film is annealed at the intended temperature of Step c) for a larger crystal grain.

23. A method as in claim 1 in which Step c) includes using a Rapid Thermal Annealing (RTA) process at a temperature in the range from 600 to 800 degrees C., and a time duration in the range from 1 second to 15 minutes.

24. A method as in claim 23 in which Step c) includes using a Rapid Thermal Annealing (RTA) process at a temperature in the range from 700 to 750 degrees C., and a time duration in the range from 1 to 5 minutes.

25. A method as in claim 24 in which Step c) includes using a Rapid Thermal Annealing (RTA) process at a temperature of approximately 720 degrees C. and a time duration of approximately 2 minutes.

26. A method as in claim 1 wherein a glass substrate is provided, and in which Step a) includes depositing the first film overlying the glass substrate.

27. A method as in claim 1 including the further steps of:
e) forming transistor source, drain, and channel regions within the first area of crystallized film, whereby the source, drain, and channel regions are formed from a single crystal grain, without the presence of transition metal semiconductor compounds;
f) forming a gate oxide layer;
g) forming a gate electrode;
h) implanting doping species; and
i) annealing to activate the implanted species, whereby both top gate and bottom gate TFTs are formed.

28. A method as in claim 1 in which Step a) includes an amorphous first film selected from the group consisting of silicon, germanium, silicon carbide, and silicon-germanium compounds.

29. A method as in claim 1 in which Step a) includes an amorphous first film having a thickness in the range from 200 to 10,000 Å.

* * * * *